(12) United States Patent
Jo et al.

(10) Patent No.: US 11,465,163 B2
(45) Date of Patent: Oct. 11, 2022

(54) MASK UNIT FOR FABRICATING DISPLAY DEVICE

(71) Applicant: Samsung Display Co. Ltd., Yongin-si (KR)

(72) Inventors: Jun Ho Jo, Seoul (KR); Min Ho Moon, Anyang-si (KR); Young Ho Park, Suwon-si (KR); Young Suck Choi, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 79 days.

(21) Appl. No.: 16/699,796

(22) Filed: Dec. 2, 2019

(65) Prior Publication Data

US 2020/0238323 A1   Jul. 30, 2020

(30) Foreign Application Priority Data

Jan. 24, 2019  (KR) .................... 10-2019-0009497

(51) Int. Cl.
  *C23C 16/04*   (2006.01)
  *C23C 14/04*   (2006.01)
  *B05B 12/20*   (2018.01)

(52) U.S. Cl.
  CPC ............ *B05B 12/20* (2018.02); *C23C 14/042* (2013.01); *C23C 16/042* (2013.01)

(58) Field of Classification Search
  CPC ...................... C23C 14/042; C23C 16/042
  See application file for complete search history.

(56) References Cited

U.S. PATENT DOCUMENTS

| | | | |
|---|---|---|---|
| 2007/0190889 A1* | 8/2007 | Lee ..................... | C23C 14/042 445/47 |
| 2015/0007767 A1* | 1/2015 | Ko ........................ | C23C 14/042 118/504 |
| 2015/0034005 A1* | 2/2015 | Ko ........................ | C23C 14/042 118/504 |
| 2015/0068456 A1* | 3/2015 | Kuriyama ............. | C23C 14/042 118/505 |
| 2016/0260935 A1* | 9/2016 | Lee ....................... | C23C 14/042 |
| 2017/0110661 A1* | 4/2017 | Lee ....................... | C23C 14/042 |
| 2018/0040857 A1* | 2/2018 | Hong .................... | C23C 14/042 |
| 2019/0316245 A1* | 10/2019 | Nakamura ........... | C23C 14/042 |
| 2019/0352765 A1* | 11/2019 | Ono ..................... | C23C 14/042 |
| 2019/0368025 A1* | 12/2019 | Kim ..................... | C23C 14/042 |

FOREIGN PATENT DOCUMENTS

| | | |
|---|---|---|
| KR | 101384278 B1 | 4/2014 |
| KR | 1020140122067 | * 10/2014 |

* cited by examiner

*Primary Examiner* — Binu Thomas
(74) *Attorney, Agent, or Firm* — Cantor Colburn LLP

(57) ABSTRACT

A deposition mask unit includes a deposition mask sheet including a plurality of openings, and a deposition mask frame including a raised portion at which the deposition mask sheet is attachable to the deposition mask frame. The raised portion includes a support portion, and a bonding portion protruding from an upper surface of the support portion, an upper surface of the bonding portion being curved.

19 Claims, 17 Drawing Sheets

MASK UNIT FOR FABRICATING DISPLAY DEVICE

This application claims priority to Korean Patent Application No. 10-2019-0009497, filed on Jan. 24, 2019, and all the benefits accruing therefrom under 35 U.S.C. § 119, the disclosure of which is incorporated herein by reference in its entirety.

BACKGROUND

1. Field

The present disclosure relates to a mask unit, and more particularly, to a mask unit used to deposit an organic layer in a manufacturing process of a display device.

2. Description of the Related Art

With the development of multimedia, display devices are becoming increasingly important. Accordingly, various types of display devices such as organic light emitting displays and liquid crystal displays are being used.

Among the display devices, an organic light emitting display may have a patterned emission layer structure depending on the design of an organic layer. In the organic light emitting display having the patterned emission layer structure, light emitting layers with which different color light is emitted are provided in a plurality of pixels, respectively.

In the organic light emitting display, for example, a red organic light emitting layer for emitting red light, a green organic light emitting layer for emitting green light, and a blue organic light emitting layer for emitting blue light may be provided in a red subpixel, a green subpixel, and a blue subpixel, respectively. The organic light emitting layers may respectively be pattern-deposited on light emitting regions of the organic light emitting display using a mask unit (e.g., a fine metal mask ("FMM")) in which openings are defined respectively corresponding to the subpixels of the organic light emitting display.

SUMMARY

One or more embodiment provides a deposition mask unit which includes relatively high-resolution patterns, secures a sufficient contact area for a deposition mask under a tensile force in the process of being fixed to a deposition mask frame, and is not penetrated or torn by welding.

However, features the present disclosure are not restricted to the one set forth herein. The above and other features of the present disclosure will become more apparent to one of ordinary skill in the art to which the present disclosure pertains by referencing the detailed description of the present disclosure given below.

An embodiment a deposition mask unit includes: a deposition mask sheet including a plurality of openings, and a deposition mask frame including a raised portion at which the deposition mask sheet is attachable to the deposition mask frame, the raised portion including: a support portion, and a bonding portion protruding from an upper surface of the support portion, an upper surface of the bonding portion being curved.

In an exemplary embodiment, the deposition mask sheet attached to the deposition mask frame may be spaced apart from the support portion.

In an exemplary embodiment, a thickness of the deposition mask sheet may be about 1 micrometer ($\mu m$) to about 100 $\mu m$.

In an exemplary embodiment, a maximum height of the upper surface of the bonding portion from the upper surface of the support portion may be equal to the thickness of the deposition mask sheet.

In an exemplary embodiment, a deposition material is passable through the plurality of openings of the deposition mask sheet, and a distance between adjacent openings may be about 5 $\mu m$ to about 15 $\mu m$.

In an exemplary embodiment, a number of the openings may be about 1,000,000 or more.

In an exemplary embodiment, a maximum height of the upper surface of the bonding portion from the upper surface of the support portion may be about 0.01 millimeter (mm) to about 0.03 mm.

In an exemplary embodiment, the support portion may include a lower surface opposite to the upper surface of the support portion, and the upper surface of the support portion may include a first upper surface portion and a second upper surface portion located at different heights from the lower surface.

In an exemplary embodiment, a first thickness between the lower surface and the first upper surface portion may be about 15 mm to about 20 mm, and a second thickness between the lower surface and the second upper surface portion may be about 12 mm to about 16 mm.

In an exemplary embodiment, the support portion may further include an intermediate side surface which connects the first upper surface portion and the second upper surface portion to each other, the intermediate side surface being inclined with respect to the lower surface.

In an exemplary embodiment, the support portion and the bonding portion may include different materials from each other.

In an exemplary embodiment, the bonding portion may include at least one of aluminum, copper, nickel and magnesium.

In an exemplary embodiment, a height of the first upper surface portion from the lower surface may be greater than a height of the second upper surface portion from the lower surface, and the bonding portion may protrude from the first upper surface portion.

An embodiment of a deposition mask unit includes a deposition mask frame including: a plurality of deposition mask sheets each including a plurality of openings; and a deposition mask frame including a plurality of raised portions at which the plurality of the deposition mask sheets is respectively attachable to the deposition mask frame, the plurality of raised portions spaced apart from each other in a first direction by a plurality of depressed portions. Each of the raised portions includes a support portion, and a bonding portion protruding from an upper surface of the support portion. The plurality of the deposition mask sheets attached to the deposition mask frame disposes the plurality of the deposition mask sheets contacting the bonding portion and spaced apart from the support portion.

In an exemplary embodiment, the raised portions and the depressed portions may alternate with each other in the first direction.

In an exemplary embodiment, deposition mask sheets among the plurality of the deposition mask sheets attached to the deposition mask frame may be spaced apart from each other in the first direction.

In an exemplary embodiment, the plurality of the deposition mask sheets attached to the deposition mask frame may dispose the depressed portions respectively between adjacent deposition mask sheets among the plurality of the deposition mask sheets.

In an exemplary embodiment, an upper surface of the bonding portion may be curved, and the plurality of the deposition mask sheets attached to the deposition mask frame may be welded to the upper surface of the bonding portion.

In an exemplary embodiment, the deposition mask frame may define an opening area, and the plurality of the deposition mask sheets attached to the deposition mask frame may overlap the opening area.

In an exemplary embodiment, the plurality of the deposition mask sheets may include an Invar alloy.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
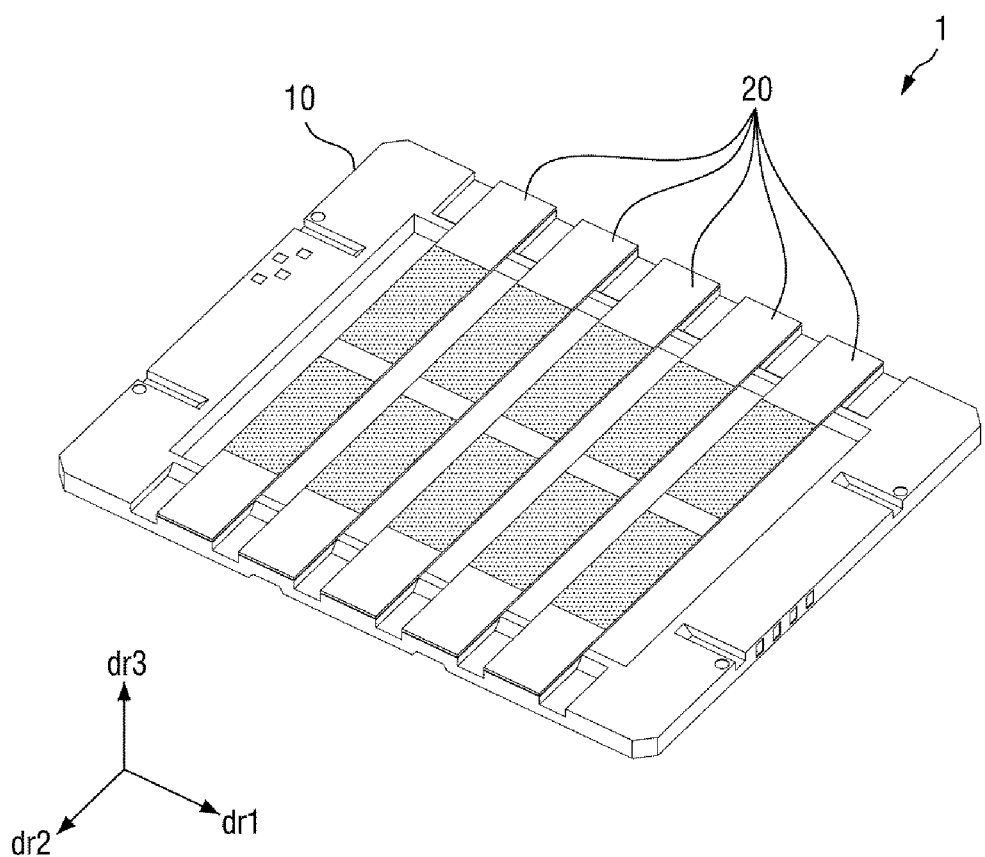
FIG. 1 is a schematic perspective view of an embodiment of a mask unit.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being related to another element such as being "on" another layer or substrate, it can be directly on the other layer or substrate, or intervening layers may also be present. In contrast, when an element is referred to as being related to another element such as being "directly on" another element, there are no intervening elements present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross-section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A deposition mask unit according to one or more embodiment may be used in a deposition process for depositing an organic material layer and/or inorganic layer material layer of a display device, such as on a substrate of the display device. The deposition mask unit may include a deposition mask frame to which one or more of a deposition mask is fixable. For convenience of description, the deposition mask unit, the deposition mask frame and the deposition mask described above are referred to throughout this disclosure as a mask unit, a mask frame and a mask sheet.

The display device may be an organic light emitting display, a liquid crystal display, or a micro light emitting diode ("LED") display. The deposition mask unit may be used to deposit an organic light emitting layer or an organic thin film (such as a hole injection layer or a transport layer or an electrode injection/transport layer) of an organic light emitting display as an example display device, and may also be used to deposit other organic films, inorganic films, metal patterns, etc. of the display device.

Hereinafter, embodiments of the present disclosure will be described in greater detail with reference to the attached drawings. Like elements in the drawings will be indicated by like or similar reference numerals.

Figure 2:
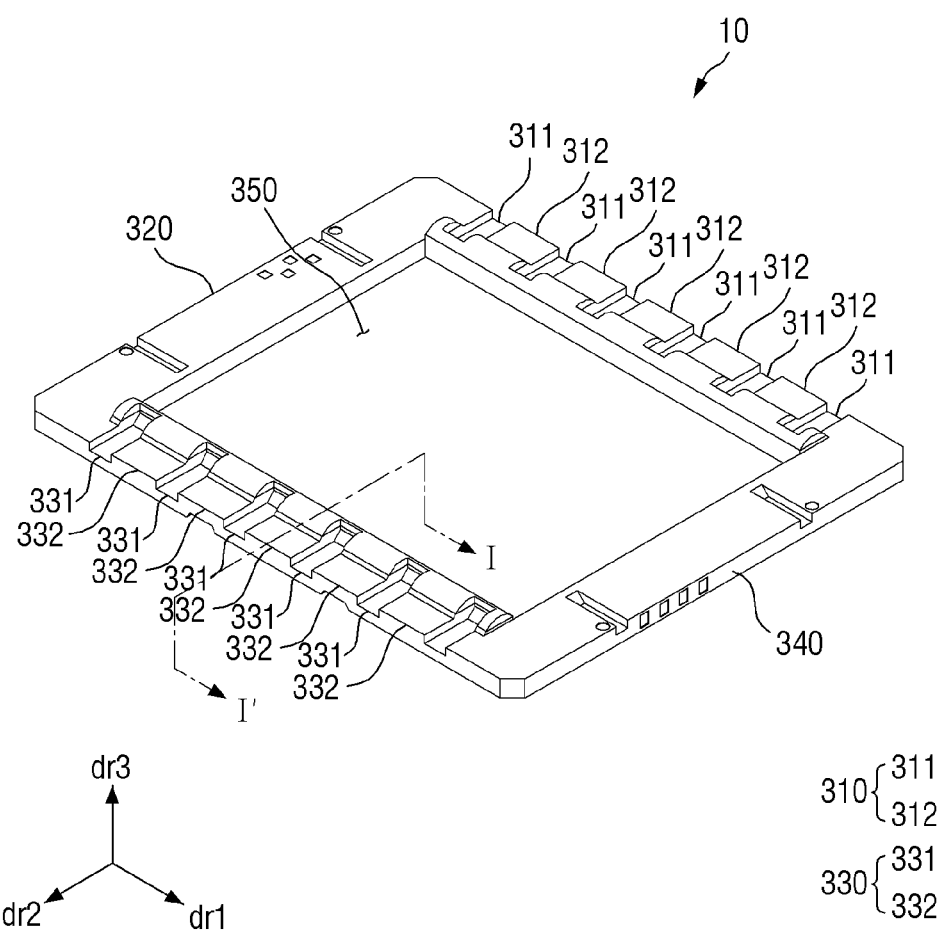
FIG. 2 is a perspective view of an embodiment of a mask frame of the mask unit of FIG. 1.
Figure 3:
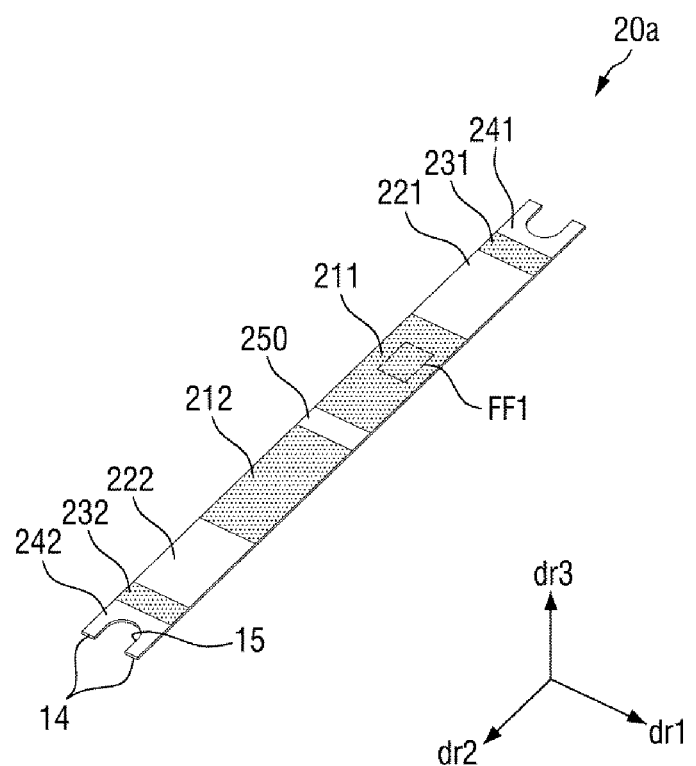
FIG. 3 is a perspective view of an embodiment of a mask sheet of the mask unit of FIG. 1.
Figure 4:
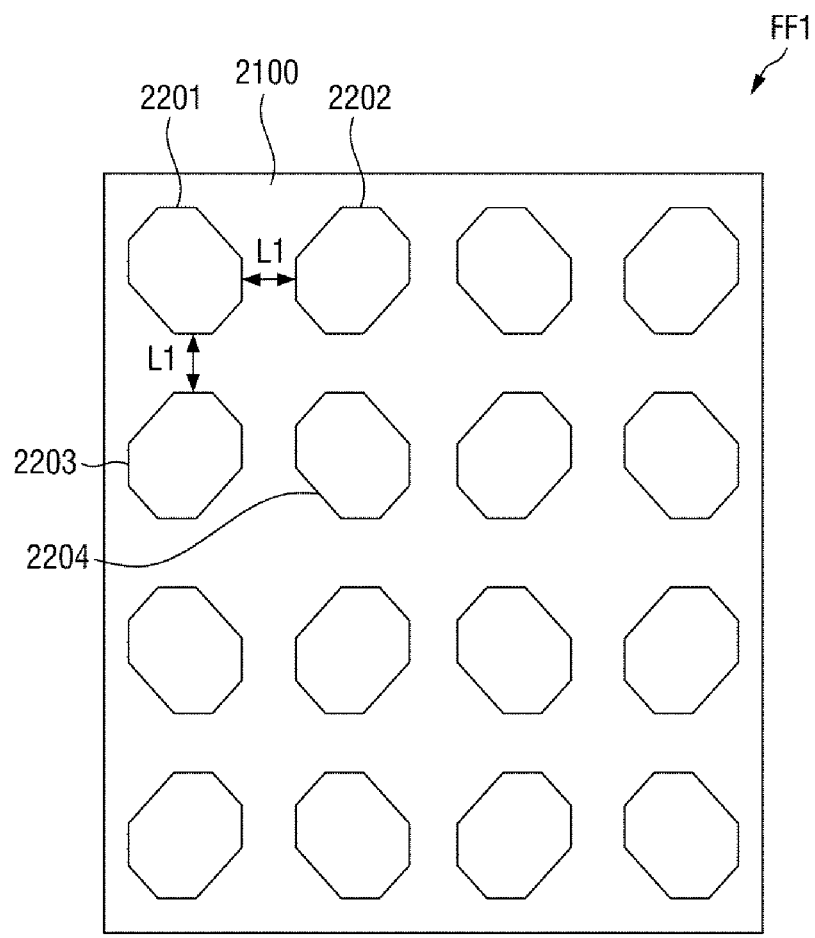
FIG. 4 is an enlarged top plan view of portion FF1 of FIG. 3.

FIG. 1 is a schematic perspective view of an embodiment of a mask unit 1. FIG. 2 is a perspective view of an embodiment of a mask frame of the mask unit 1 of FIG. 1. FIG. 3 is a perspective view of an embodiment of a mask sheet 20a of the mask unit 1 of FIG. 1. FIG. 4 is an enlarged top plan view of portion FF1 of FIG. 3.

Referring to FIGS. 1 through 4, the mask unit 1 is largely composed of the mask frame 10 having a rectangular shape and a plurality of mask sheets 20, each shaped like a flat plate having a predetermined thickness and mountable on the mask frame 10.

The mask frame 10 may define an area through which a deposition material passes. That is, the mask frame 10 may define a planar area thereof as a deposition area at which the deposition material passes through the mask frame 10 to be provided on a target substrate below the mask frame 10. Here, the plurality of mask sheets 20 may be arranged and fixed on an upper surface of the mask frame 10. In particular, the mask sheet 20a among a plurality thereof may be fixed on the mask frame 10 while a tensile force F is applied to the mask sheet 20a.

The mask frame 10 is a rectangular frame having a first opening area 350 having a substantially rectangular shape at a center of the mask frame 10 and includes a first member 310, a second member 320, a third member 330 and a fourth member 340 connected to each other to form the rectangular frame. The first member 310 and the third member 330 may face each other across the first opening area 350 and may be perpendicularly connected to the second member 320 and the fourth member 340, respectively. Here, the second member 320 and the fourth member 340 may face each other across the first opening area 350.

The first member 310 and the third member 330 may correspond to relatively long sides of the rectangular frame lengthwise extending in a first direction dr1, and the second member 320 and the fourth member 340 may correspond to relatively short sides of the rectangular frame lengthwise extending in a second direction dr2. Here, the first direction dr1 and the second direction dr2 can be understood as directions intersecting each other. In addition, a third direction dr3 may be a thickness direction of the mask unit 1 and can be understood as a direction intersecting both the first direction dr1 and the second direction dr2.

The mask sheet 20a may be in the form of a stick separate from the mask frame 10 before the mask unit 1 is manufactured. Here, the mask unit 1 may include the mask sheet 20a provided in plurality. More than one of the mask sheet 20a may be arranged adjacent to each other in the first direction dr1. Each mask sheet 20a may be a fine metal mask ("FMM") having a plurality of openings (first openings 2201, 2202, 2203 and 2204) arranged in a pattern corresponding to a pattern of a thin film to be provided or formed on a target substrate.

Each mask sheet 20a includes a body including a body portion 241, 242 and 250, deposition portions 211 and 212, dummy portions 231 and 232, and coupling portions 221 and 222. The body portion 241, 242 and 250 and the coupling portions 221 and 222 may be planar areas of the body which are solid (e.g., excluding an opening). The dummy portions 231 and 232 depositions portions 211 and 212 are planar areas of the body which include openings alternated with solid portions of the body, such as to form a matrix of openings separated by the solid portions of the body. The dummy portions 231 and 232 may also be planar areas of the body which include openings separated by solid portions of the body. The body portion 241, 242 and 250, the deposition portions 211 and 212, the dummy portions 231 and 232, and the coupling portions 221 and 222 together define a whole of the mask sheet 20a.

The body of the mask sheet 20a may be provided or formed in the shape of a plate having relatively long sides and relatively short sides. At least one of the opposing ends of the body may be recessed. In an embodiment, for example, a recess may be defined in at least one of the relatively short sides of the body, such as at the body portion 241 or 242. Referring to FIG. 3, for example, at least one of the relatively short sides of the body at the body portion 241 or 242 may include a linear portion 14 provided or formed as a straight line and a recessed portion 15 which extends from the linear portion 14. The recessed portion 15 may be recessed from the linear portion 14 in a direction from a first end of the body at the body portion 241 toward a second end of the body at the body portion 242, or in a direction from the second end of the body at the body portion 242 toward the first end of the body at the body portion 241. The recessed portion 15 may have a rounded shape in the top plan view. In an embodiment, for example, a shape of the recessed portion 15 in a top plan view may be a portion of an ellipse or a portion of a circle.

The deposition portions 211 and 212 may be disposed alternating with the body portion 241, 242 and 250. Each of the deposition portions 211 and 212 may include a plurality of first openings 2201, 2202, 2203 and 2204, and the first openings 2201, 2202, 2203 and 2204 may be arranged to form a first area 2100. The first area 2100 may include or be formed by a cluster of the first openings 2201, 2202, 2203 and 2204 arranged separated from each other by solid portions of the body. The first openings 2201, 2202, 2203 and 2204 may pass through the body portion 241, 242 and 250 to allow a deposition material to pass through the first openings 2201, 2202, 2203 and 2204.

The first openings 2201, 2202, 2203 and 2204 may have various shapes. In an embodiment, for example, the first openings 2201, 2202, 2203 and 2204 may have a polygonal planar shape such as a circle, a square, or a rhombus. Where the first openings 2201, 2202, 2203 and 2204 are octagonal in a top plan view will be mainly described below in detail. The deposition portions 211 and 212 may be disposed in a central portion of the body. In particular, one or more deposition portions 211 and 212 may be disposed alternating with the body portion 241, 242 and 250.

In an embodiment, when the first openings 2201, 2202, 2203 and 2204 are octagonal, a distance between facing sides may be about 20 micrometers (μm) to about 21 μm. A distance L1 between the first openings 2201, 2202, 2203 and 2204 respectively adjacent to each other in the first direction dr1 may be, but not necessarily, equal to a distance L1 between the first openings 2201, 2202, 2203 and 2204 adjacent to each other in the second direction dr2. The distance between adjacent first openings among the first openings 2201, 2202, 2203 and 2204 (the distance L1 between the first openings 2201, 2202, 2203 and 2204 adjacent to each other in the first direction dr1 and the distance L1 between the first openings 2201, 2202, 2203 and 2204 adjacent to each other in the second direction dr2) may be about 5 μm to about 15 μm and may correspond to a distance between pixels of a display device. That is, a pattern of the first openings 2201, 2202, 2203 and 2204 may correspond to a pattern of a thin film to be provided in the pixels of the display device. In an embodiment, a number of the first openings 2201, 2202, 2203 and 2204 may correspond to a number of the pixels of the display device.

The dummy portions 231 or 232 may be disposed at opposing ends of the body. Here, each of the dummy portions 231 and 232 may include a plurality of second openings. The second openings may be arranged in a second area (not illustrated), similar to the first area 2100 described above. In an embodiment, each of the dummy portions 231 and 232 may be defined as the second area including or formed by a cluster of the second openings separated from each other by solid portions of the body.

In an embodiment, the second area may be rectangular in shape in a top plan view. The dummy portions 231 or 232 may be separated from an end edge of the body which is defined by the recessed portion 15 and the linear portion 14 at the body portion 241 and 242, respectively. Alternatively, the dummy portions 231 and 232 including the second openings separated from each other by solid portions of the body may extend to the end edge of the body, and the body portion 241 and 242 as a solid portion may be omitted. A boundary of each of the dummy portions 231 and 232 at the opposing ends of the body may correspond to or be defined by the linear portion 14 and the recessed portion 15. Within the boundary of each of the dummy portions 231 and 232, a portion corresponding to the recessed portion 15 may be rounded.

The dummy portions 231 and 232 may be spaced apart from the deposition portions 211 and 212 along a length of the body. In addition, a pair of the dummy portion 231 and 232 may be disposed to face each other along the length of the body with respect to the deposition portions 211 and 212.

Each mask sheet 20a includes planar areas where no opening is present respectively between the dummy portions 231 and 232 and the deposition portions 211 and 212. The coupling portions 221 and 222 may be respectively located between the dummy portions 231 and 232 and the deposition portions 211 and 212 and may be defined as solid portions of the mask sheet 20a that are attachable to the mask frame 10. In addition, a pair of the coupling portions 221 and 222 may be provided in a single one of the mask sheet 20a and may face each other along the length of the body with respect to the deposition portions 211 and 212. The pair of the coupling portions 221 and 222 facing each other in the single one of the mask sheet 20a may be attached at the first member 310 and the third member 330 of the mask frame 10, respectively.

The mask sheet 20a may include a mask material. Applicable examples of the mask material include chromium (Cr), molybdenum (Mo), titanium (Ti), tin (Sn), gold (Au), nickel (Ni), nickel alloys, and nickel-cobalt alloys.

In some embodiments, the mask sheet 20a may include an Invar alloy. The Invar alloy may be an alloy of iron and nickel. In an embodiment, for example, the content of nickel in the Invar alloy may be about 36 weight percent (wt %), and the content of iron may be about 64 weight percent (wt %), with respect to a total weight of the mask sheet 20a. However, the nickel and iron contents are not limited to these example values and can be varied as needed. The Invar alloy may also include impurities such as carbon and sulfur in addition to nickel and iron.

The mask sheet 20a may be manufactured by processing a base material (not illustrated). In an embodiment, for example, the base material may be formed into a mask sheet 20a after going through a manufacturing process such as an electroforming method, an electroless plating method, a method of laser-processing a film base material, a hybrid method using both a plating method and a laser processing method, a rolling method, an etching method, etc.

In an embodiment, the mask unit 1 may be used in a method of manufacturing a display device to fabricate a display device having a relatively high resolution of 1000 pixels per square inch (ppi) or higher. This means that since a number of the first openings 2201, 2202, 2203 and 2204 may correspond to a number of the pixels of the display device, the number of the first openings 2201, 2202, 2203 and 2204 in one of the mask sheet 20a can be about 1,000,000 or more. That is, the mask sheet 20a may correspond to a relatively high-resolution display device. Pixels of the display device may correspond to the first openings 2201, 2202, 2203 and 2204 of the mask sheet 20a, respectively, in number, pattern, dimension, etc.

The mask sheet 20a may be relatively thin. In an embodiment, for example, the thickness of the mask sheet 20a along the third direction dr3 may be about 1 μm to about 100 μm. As the resolution of a display device increases, the distance between adjacent pixels decreases. Since the mask sheet 20a is relatively thin, the distance between the first openings 2201, 2202, 2203 and 2204 can be reduced even in an environment where a deposition incident angle is limited, to achieve a display device having a relatively high resolution.

The thickness of the mask sheet 20a may vary according to the deposition incident angle. In an embodiment, for example, as the deposition incident angle increases, the thickness of the mask sheet 20a may increase. In an embodiment, when the deposition incident angle is about 45 degrees, the mask sheet 20a may have a thickness of about 5 μm. When the deposition incident angle is about 60 degrees, the mask sheet 20a may have a thickness of about 8.6 μm.

The first member 310 and the third member 330 of the mask frame 10 may include a plurality of depressed portions 311 and 331 and a plurality of raised portions 312 and 332 arranged along a respective length of the first member 310 and the third member 330. Each of the depressed portions 311 and 331 may be located between adjacent raised portions among the plurality of raised portions 312 or 332. With respect to a plane in which a bottom surface of the mask frame 10 is disposed, a thickness of each of the plurality of raised portions 312 and 332 at an outer edge of the mask frame 10 is larger than a thickness of each of the plurality of depressed portions 311 and 331 at the outer edge of the mask frame 10.

When the mask sheet 20a is bonded to the mask frame 10, the mask sheet 20a may overlap the raised portions 312 and 332, respectively. When two elements "overlap" each other, the two elements overlap each other in the thickness direction (e.g., the third direction dr3) of the mask unit 1, unless otherwise defined. The depressed portions 311 and 331 and the raised portions 312 and 332 may be spaced apart from each other in the first direction dr1 and may alternate with each other.

In the mask unit 1, the mask sheet 20a may overlap the raised portions 312 and 332 of the mask frame 10. Each of the depressed portions 311 and 331 of the mask frame 10 may be located between a first one of the mask sheet 20a and a second one of the mask sheet 20a which are adjacent to each other. The depressed portions 311 and 331 may serve as reference points when the mask sheet 20a is aligned on the mask frame 10 in coupling of the mask sheet 20a to the mask frame 10.

The raised portions 312 and 332 each include a support portion 333 and a bonding portion 334 which will be described later.

A method of manufacturing the mask unit 1 will now be briefly described.

Figure 5:
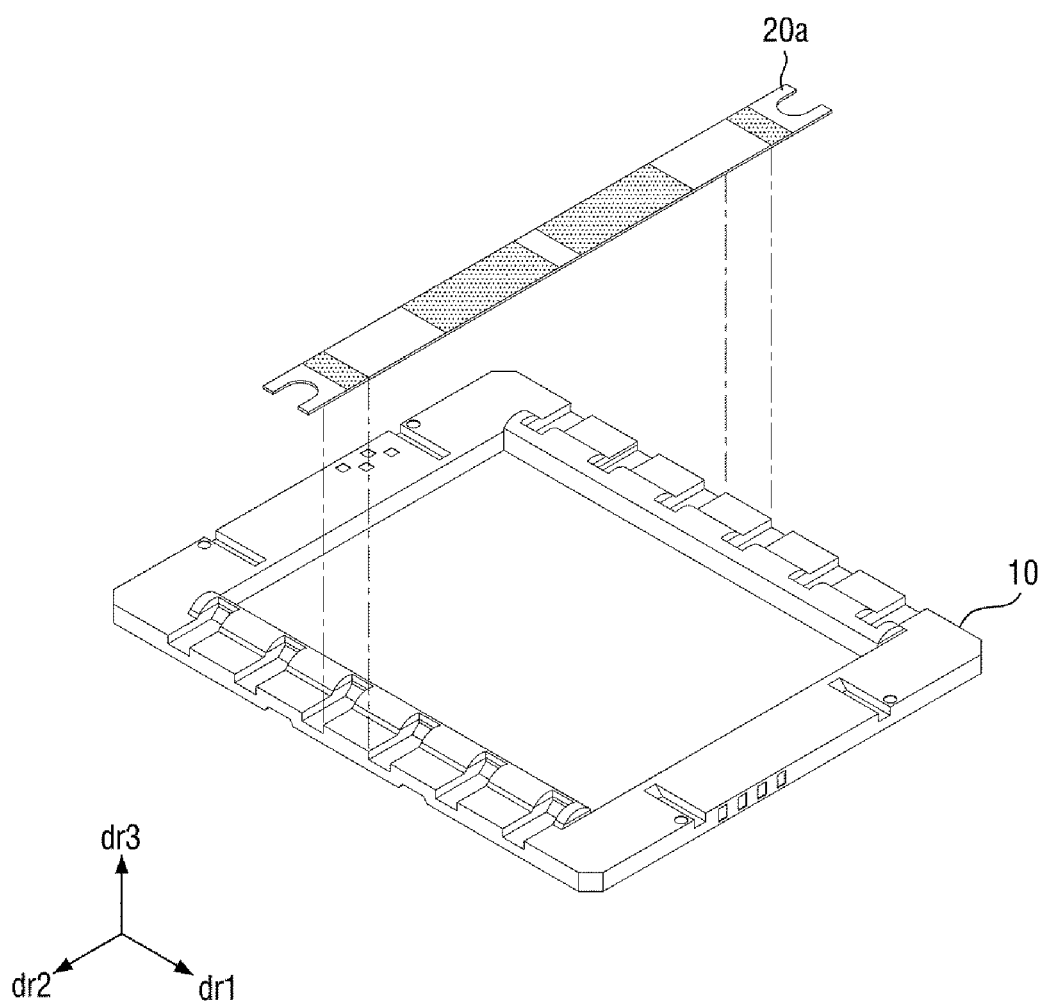
FIGS. 5 and 6 are perspective views schematically illustrating an embodiment of a manufacturing sequence of the mask unit of FIG. 1.
Figure 6:
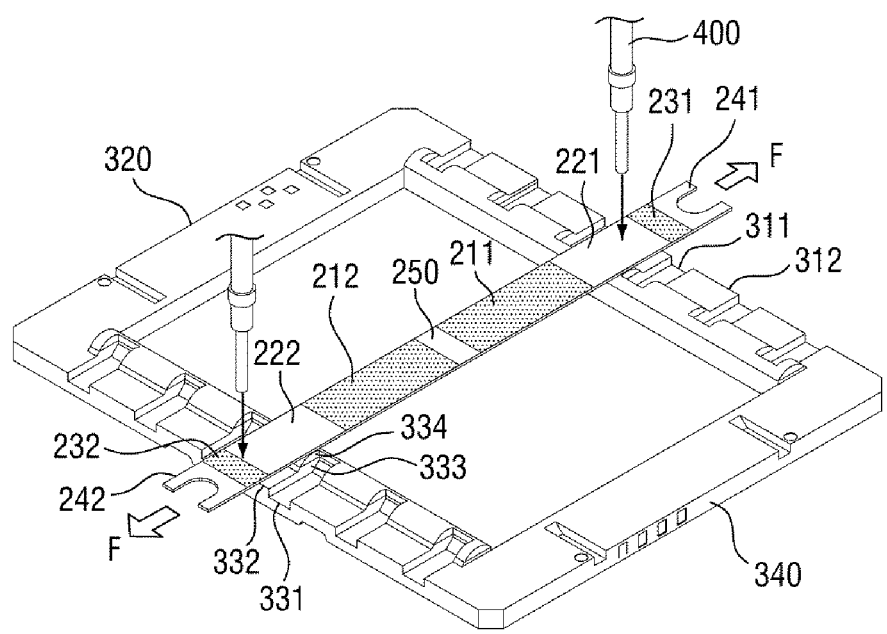

FIGS. 5 and 6 are perspective views schematically illustrating an embodiment of a manufacturing sequence in a method of manufacturing the mask unit 1.

Referring to FIG. 5, a mask sheet 20a may be placed on the mask frame 10. Here, a tensile force F may be applied to each of opposing ends of the mask sheet 20a. In placing the mask sheet 20a, the mask frame 10 may be placed to be overlapped by the coupling portions 221 and 222 of the mask sheet 20a.

After the mask sheet 20a is placed on the mask frame 10, the mask sheet 20a may be fixed to the mask frame 10. Here, the mask sheet 20a may be fixed to the mask frame 10 by welding. In particular, a laser welder 400 may be used to weld the mask sheet 20a to the mask frame 10. The coupling portions 221 and 222 of the mask sheet 20a which are respectively disposed between the dummy portions 231 and 232 and the deposition portions 211 and 212, may be attached and fixed to the mask frame 10 by the welding.

While the mask sheet 20a is welded to the mask frame 10, the tensile force F may be continuously applied to the mask sheet 20a. The body portion 241 and 242 and the dummy portions 231 and 232 of the mask sheet 20a may extend further than an outer edge of the mask frame 10, by application of the tensile force F.

Referring to FIG. 6, after the mask sheet 20a is welded to the mask frame 10, a portion of the body of the mask sheet 20a which extends further than the outer edge of the mask frame 10 may be removed. The portion may include body portion 241 and 242 and the dummy portions 231 and 232, without being limited thereto. Here, the portion of the body of the mask sheet 20a which extends further than the outer edge of the mask frame 10 may be removed in various ways. In an embodiment, for example, the portion of the body of the mask sheet 20a which extends further than the outer edge of the mask frame 10 may be removed using a laser. In another embodiment, the portion of the body of the mask sheet 20a which extends further than the outer edge of the mask frame 10 may be removed using a cutting blade.

After the removal of the portion of the body of the mask sheet 20a which extends further than the outer edge of the mask frame 10, the mask unit 1 in which the mask sheet 20a is fixed to the mask frame 10 may be provided.

The structure of the mask frame 10 including the mask sheet 20a fixed to the mask frame 10, will now be described in detail with reference to FIGS. 7 and 8.

Figure 7:
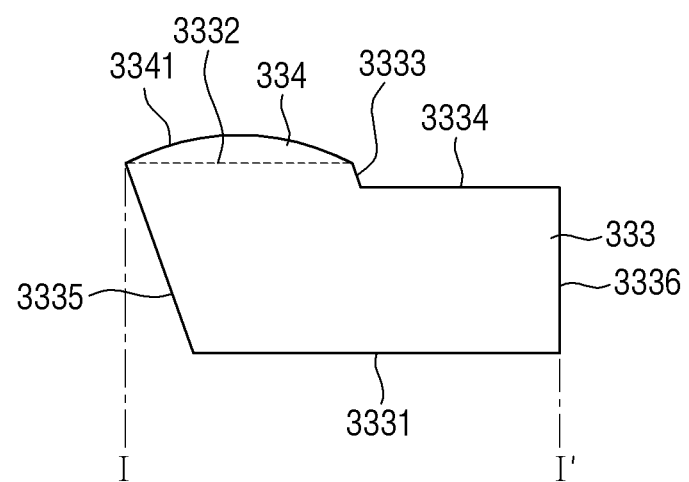
FIG. 7 is a cross-sectional view taken along line I-I' of FIG. 2.
Figure 7:
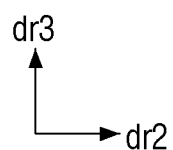

FIG. 7 is a cross-sectional view taken along line I-I' of FIG. 2. FIG. 8 is a cross-sectional view illustrating a tensile-force applying and welding process of a mask sheet 20a. A cross section of the mask frame 10 illustrated in FIGS. 7 and 8 is a cross-section of any one of the first member 310 and the third member 330 which is bonded to an end portion of the mask sheet 20a.

Figure 8:
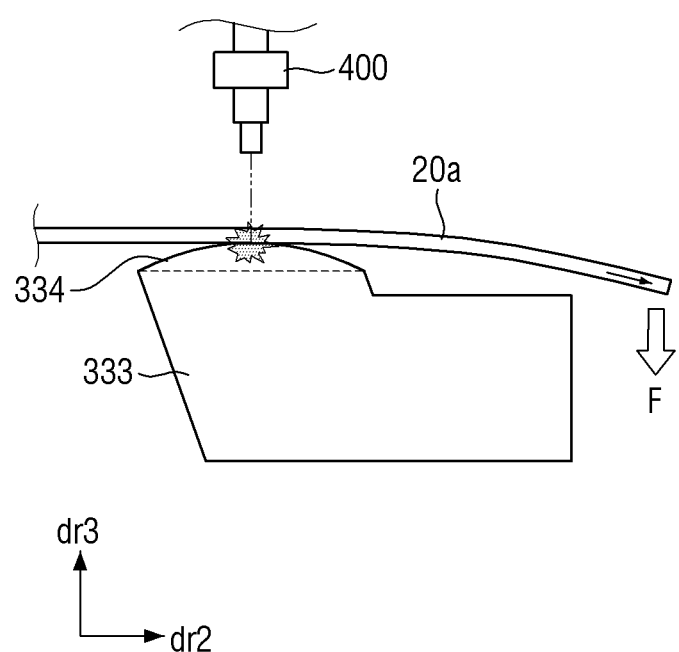
FIG. 8 is a cross-sectional view illustrating an embodiment of a tensile-force applying and welding process of a mask sheet.

Referring to FIGS. 7 and 8, the mask frame 10 may include or be defined by the support portion 333 and the bonding portion 334. More particularly, the raised portions 312 and 332 of the first member 310 and the third member 330 each includes or is defined by the support portion 333 and the bonding portion 334.

Each of the raised portions 312 and 332 of the mask frame 10 includes the bonding portion 334 defined as a portion that contacts the mask sheet 20a, and the support portion 333 serving as a base to the bonding portion 334. That is, the bonding portion 334 may include a contact surface which contacts the mask sheet 20a, and an upper surface 3341 of the bonding portion 334 may be the contact surface.

The bonding portion 334 may be convex in cross-section. In an embodiment, for example, the bonding portion 334 may protrude in the third direction dr3 from a plane in which an upper surface (e.g., a second upper side 3334) of the support portion 333 is disposed. That is, the mask frame 10 may include a protrusion on the upper surface of the support portion 333. In an embodiment, the upper surface 3341 of the bonding portion 334 may be curved. That is, the upper surface 3341 of the bonding portion 334 may be a surface convexly-curved with respect to the support portion 333. A shape of the convex surface may be shaped like a circular arc as a portion of a circle or an elliptical arc as a portion of an ellipse, having a predetermined curvature in cross-section. In an embodiment, the curvature of the upper surface 3341 of the bonding portion 334 may be about 0.5 millimeter (mm) to about 5 millimeters (mm). There may be substantially no boundary or interface between the support portion 333 and the bonding portion 334. For ease of description, an imaginary line (dotted line in FIG. 7) at which the convex surface of the bonding portion 334 starts with respect to the support portion 333 will be expressed as the boundary between the support portion 333 and the bonding portion 334.

A cross-section of the support portion 333 may have various shapes. In cross-section, the support portion 333 may include a lower side 3331, and a first upper side 3332 and a second upper side 3334 located at different heights from the lower side 3331. In an embodiment, for example, the support portion 333 may include the first upper side 3332 whose height from the lower side 3331 is greater than a height of the second upper side 3334 from the lower side 3331. That is, in the support portion 333, a first thickness of the mask frame 10 defined at or formed by the first upper side 3332 and the lower side 3331 may be greater than a second thickness of the mask frame 10 defined at or formed by the second upper side 3334 and the lower side 3331. In an embodiment, the first thickness may be about 15 mm to about 20 mm. The second thickness may be about 12 mm to about 16 mm. The difference between the first thickness and the second thickness may be about 2 mm to about 3 mm.

Both planes in which the first upper side 3332 and the second upper side 3334 are disposed may be, but not necessarily, substantially parallel to a plane in which the lower side 3331 is disposed. The first upper side 3332 may be located closer to the first opening area 350 than the second upper side 3334 along the second direction dr2. That is, the second upper side 3334 may be disposed outside the first upper side 3332 with respect to the first opening area 350.

The support portion 333 may further include an intermediate side 3333 between the first upper side 3332 and the second upper side 3334 in cross-section. The intermediate side 3333 may form an angle with each of the first upper side 3332, the second upper side 3334, and the lower side 3331. The angle, as used herein, means an acute angle formed with an imaginary straight line extending in a direction (e.g., the second direction dr2) in which the lower side 3331 extends.

The support portion 333 may, in cross-section, further include a first side 3335 connecting the first upper side 3332 and the lower side 3331 to each other and a second side 3336 connecting the second upper side 3334 and the lower side 3331 to each other. The first side 3335 may be defined as a side located closer to the first opening area 350 than the second side 3336. The first side 3335 and/or the second side 3336 may be inclined with respect to the lower side 3331. In an embodiment, an angle formed by the first side 3335 and the lower side 3331 may be an obtuse angle, for example, greater than about 90 degrees and less than about 130 degrees. In some embodiments, the second side 3336 and the lower side 3331 may be substantially perpendicular to each other.

The lower side 3331, the first upper side 3332, the intermediate side 3333, the second upper side 3334, the first side 3335 and the second side 3336 may include or define a lower surface, a first upper surface portion, an intermediate side surface, a second upper surface portion, a first side surface and a second side surface, respectively, of the support portion 333. The cross-sectional shape of the support portion 333 is not limited to the shape illustrated in the drawings. In some embodiments, the support portion 333 may not include the second upper side 3334 and may include only the first upper side 3332 in cross-section (that is, the intermediate side 3333 is omitted), and both the first side 3335 and the second side 3336 may form right angles with the lower side 3331.

The bonding portion 334 may be provided or formed on an upper surface of the support portion 333. The bonding portion 334 may be provided or formed by a wet-etching process or a laser processing process. In the cross-section of the mask frame 10, the bonding portion 334 may be provided or formed on a first upper surface portion of the support portion 333 including or defined by the first side 3332 and may not be provided or formed on a second upper surface portion of the support portion 333 including or defined by the second upper side 3334.

The bonding portion 334 may protrude from the upper surface of the support portion 333 to a height of up to about 0.01 mm to about 0.03 mm. In an embodiment, for example, the height from the first upper side 3332 to the upper surface 3341 of the bonding portion 334 may be about 0.01 mm to about 0.03 mm. In some embodiments, the maximum height of the bonding portion 334 from the upper surface of the support portion 333 may be substantially equal to the thickness of the mask sheet 20a.

In an embodiment, the bonding portion 334 and the support portion 333 may include the same material as each other and may be provided or formed at the same time as each other. The bonding portion 334 and the support portion 333 of the mask frame 10 may each include a metal material with relatively high rigidity, for example, a metal such as stainless steel. In an embodiment, the support portion 333 may be extended to define a protruding portion thereof which defines the bonding portion 334, without being limited thereto.

During bonding of the mask sheet 20a to the mask frame 10, the tensile force F may be applied to the mask sheet 20a. An external force (e.g., the tensile force F) may be applied in a direction from an end portion of the mask sheet 20a toward the mask frame 10 (e.g., in a direction opposite to the third direction dr3 in the drawings), in addition to a direction along the second direction dr2 and away from the first opening area 350. While this external force is applied, a contact surface at which the mask sheet 20a and the bonding portion 334 of the mask frame 10 contact each other may be increased, thereby increasing a welding success rate. That is, even if the mask sheet 20a is relatively thin, the contact surface can be increased to increase the welding success rate relative to the mask frame 10.

Next, other embodiments of mask units will be described. In the following embodiments, the same elements as those of FIGS. 1 through 8 will not be repeated and will be indicated by the same or similar reference numerals.

Figure 9:
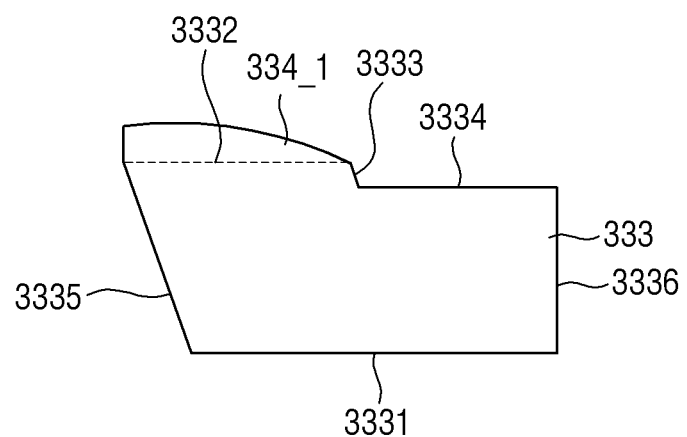
FIG. 9 is a cross-sectional view of a modified embodiment of a mask frame of a mask unit.
Figure 9:
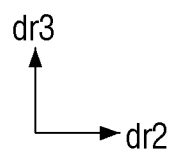

FIG. 9 is a cross-sectional view of a modified embodiment of a mask frame of a mask unit.

Referring to FIG. 9, a modified embodiment of the mask frame of a mask unit is different from the mask frame 10 of FIG. 7 in the shape of an upper surface of a bonding portion 334_11.

The upper surface of the bonding portion 334_11 may be a sloping curved surface. When a tensile force is applied to a mask sheet 20a, a contact surface between the upper surface of the bonding portion 334_11 and the mask sheet 20a may be increased, thereby increasing the welding success rate.

Figure 10:
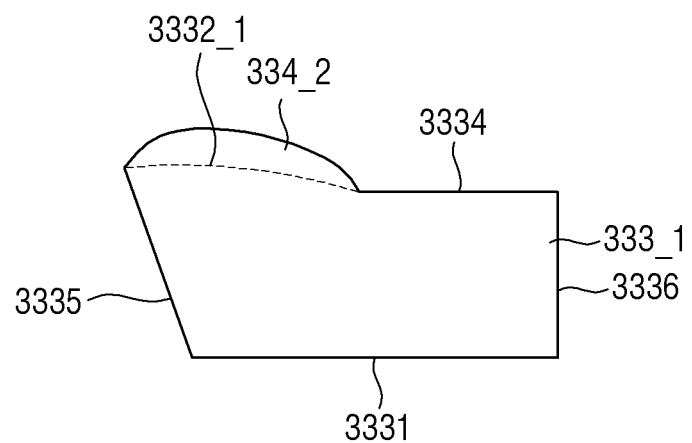
FIG. 10 is a cross-sectional view of another modified embodiment of a mask frame of a mask unit.
Figure 10:
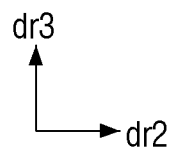

FIG. 10 is a cross-sectional view of another modified embodiment of a mask frame of a mask unit.

Referring to FIG. 10, another modified embodiment of the mask frame of the mask unit is different from the mask frame 10 of FIG. 7 in that the intermediate side 3333 is omitted.

An upper surface of a bonding portion 334_12 may contact a second upper side 3334 of a support portion 333_1. Since the upper surface of the bonding portion 334_12 is curved, a contact surface between the upper surface of the bonding portion 334_12 and a mask sheet 20a may be increased when a tensile force is applied to the mask sheet 20a, thereby increasing the welding success rate.

Figure 11:
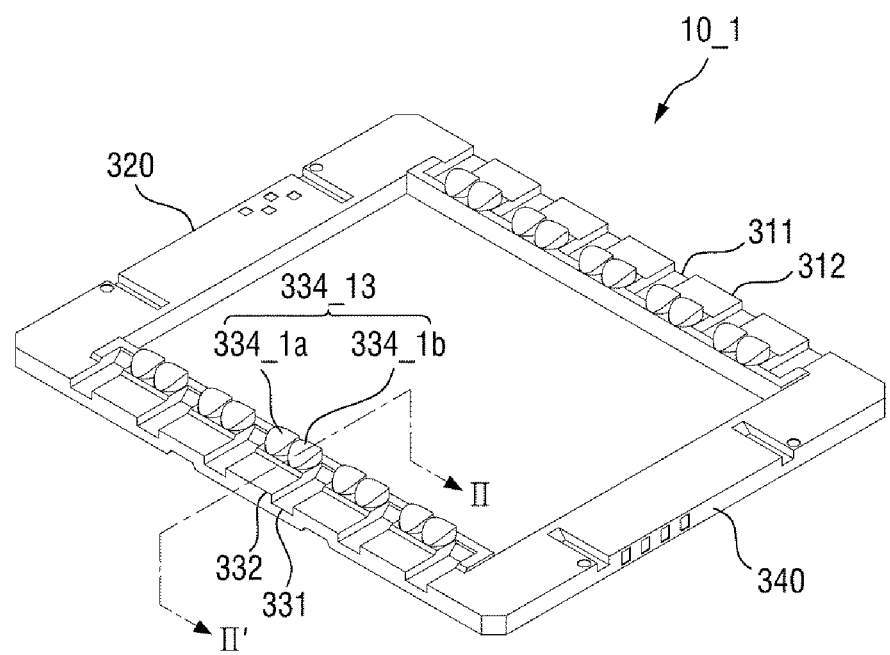
FIG. 11 is a perspective view of another embodiment of a mask frame of a mask unit.
Figure 11:
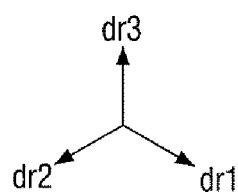
Figure 12:
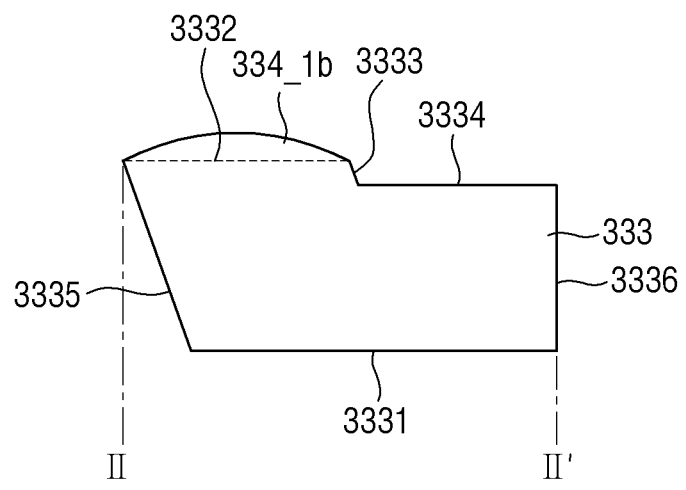
FIG. 12 is a cross-sectional view taken along line II-II' of FIG. 11.

FIG. 11 is a perspective view of another embodiment of a mask frame 10_1 of a mask unit. FIG. 12 is a cross-sectional view taken along line II-II' of FIG. 11.

Referring to FIGS. 11 and 12, the mask frame 10_1 of the mask unit is different from the mask frame 10 of FIGS. 2 and 7 in that the mask frame 10_1 includes a plurality of contact surfaces of the raised portions 312 and 332 which each contact a same one of the mask sheet 20a. The plurality of contact surfaces within each one of the raised portions 312 and 332 is arranged along the first direction dr1.

The mask frame 10_1 may include a plurality of bonding surfaces that contact a same one of the mask sheet 20a. That is, a bonding portion 334_13 may include a plurality of protrusions that contact a same one of the mask sheet 20a. That is, locations of the two largest thicknesses of the bonding portion 334_13 are arranged spaced apart from each other along the first direction dr2.

The bonding portion 334_13 may include a first protrusion 334_1a and a second protrusion 334_1b disposed adjacent to each other in the first direction dr1. Both the first protrusion 334_1a and the second protrusion 334_1b may be provided or formed on a first upper surface of the support portion 333. Both the first protrusion 334_1a and the second protrusion 334_1b may contact the same one of the mask sheet 20a disposed at the first member 310 or the third member 330, respectively. The first protrusion 334_1a and the second protrusion 334_1b may each include a planar area which is welded to the same one of the mask sheet 20a.

Each of the first protrusion 334_1a and the second protrusion 334_1b may have a shape such as a portion of a cylinder which is cut to have a curved upper surface. However, each of the first protrusion 334_1a and the second protrusion 334_1b can have various shapes such as a hemispherical shape as long as the upper surface is curved.

The upper surface of each of the first protrusion 334_1a and the second protrusion 334_1b may have a shape of a circular arc being a portion of a circle, in cross-section. In an embodiment, the first protrusion 334_1a and the second protrusion 334_1b may be spaced apart from each other along the first direction dr1 with the first upper surface of a support portion 333 exposed therebetween or may be disposed in contact with each other along the first direction dr1.

A contact surface of each of the first protrusion 334_1a and the second protrusion 334_1b with a same one of the mask sheet 20a may be increased by a tensile force applied to the mask sheet 20a during the providing of the mask unit. That is, when the same one of the mask sheet 20a is bonded to the first protrusion 334_1a and the second protrusion 334_1b , the welding success rate can be increased.

The number and arrangement of protrusions at each of the raised portions 312 and 332 are not limited to those illustrated in the drawings. In an embodiment, the bonding portion 334_13 may include three or more protrusions disposed adjacent to each other in the first direction dr1 at each of the raised portions 312 and 332.

Figure 13:
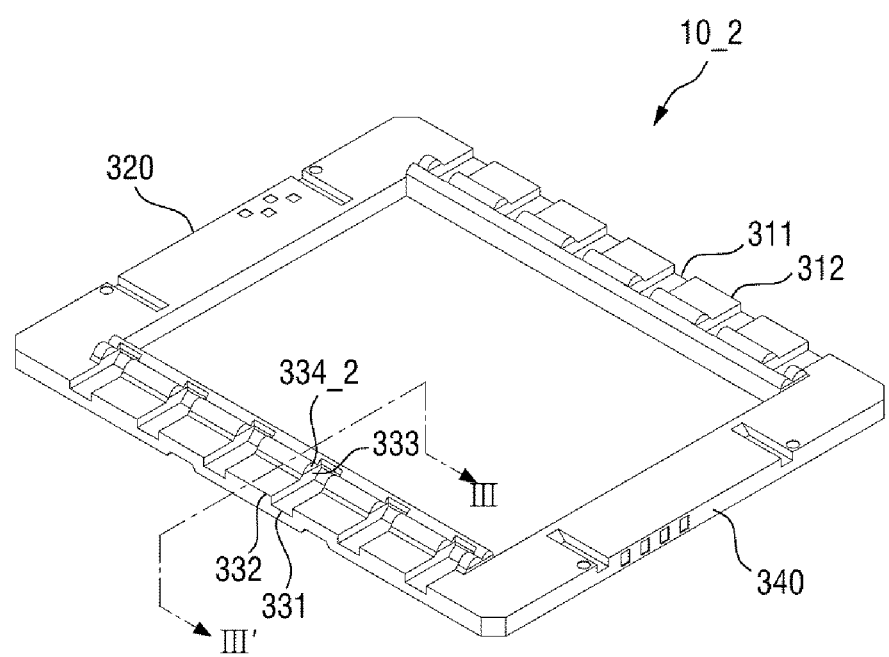
FIG. 13 is a perspective view of still another embodiment of a mask frame in the mask unit.
Figure 13:
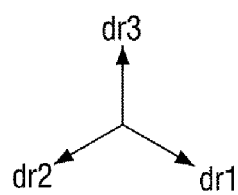
Figure 14:
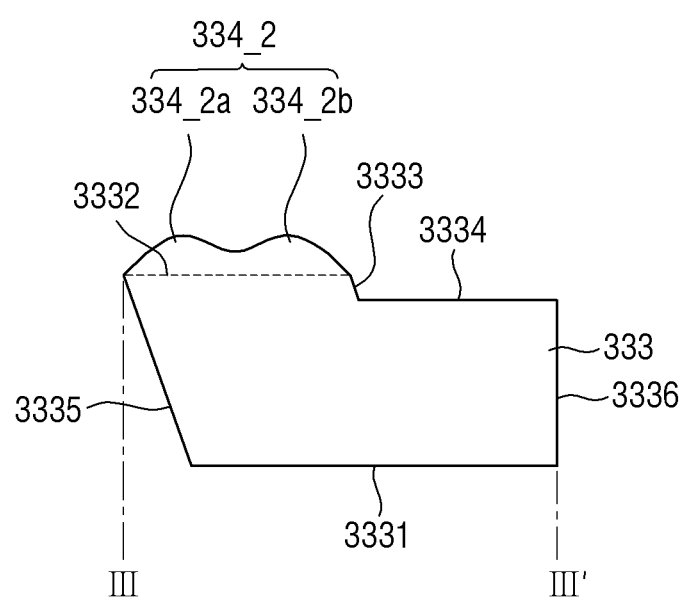
FIG. 14 is a cross-sectional view taken along line of FIG. 13.

FIG. 13 is a perspective view of still another embodiment of a mask frame 10_2 of a mask unit. FIG. 14 is a cross-sectional view taken along line of FIG. 13.

Referring to FIGS. 13 and 14, the mask frame 10_2 of the mask unit is different from the mask frame 10 of FIGS. 2 and 7 in that the mask frame 10_2 includes a plurality of contact surfaces of the raised portions 312 and 332 which each contact a same one of the mask sheet 20a. The plurality of contact surfaces within each one of the raised portions 312 and 332 is arranged along the second direction dr2. That is, locations of the two largest thicknesses of the bonding portion 334_2 are arranged spaced apart from each other along the second direction dr2.

The mask frame 10_2 may include a plurality of bonding surfaces that contact a same one of the mask sheet 20a. That is, a bonding portion 334_2 may include a plurality of protrusions 334_2a and 334_2b that contact one of the mask sheet 20a.

The bonding portion 334_2 may include a first protrusion 334_2a and a second protrusion 334_2b disposed adjacent to each other in the second direction dr2. Both the first protrusion 334_2a and the second protrusion 334_2b may be provided or formed on a first upper surface of a support portion 333. Both the first protrusion 334_2a and the second protrusion 334_2b may contact a same one of the mask sheet 20a. The first protrusion 334_2a and the second protrusion 334_2b may each include a planar area which is welded to the same one of the mask sheet 20a.

The first protrusion 334_2a and the second protrusion 334_2b may be arranged continuously, that is, to contact each other in the second direction dr2.

A contact surface of each of the first protrusion 334_2a and the second protrusion 334_2b with a same one of the mask sheet 20a may be increased by a tensile force applied to the same one of the mask sheet 20a during the providing of the mask unit. That is, when the same one of the mask sheet 20a is bonded to the first protrusion 334_2a and the second protrusion 334_2b, the welding success rate can be increased.

The number and arrangement of protrusions are not limited to those illustrated in the drawings. In an embodiment, the bonding portion 334_2 may include three or more protrusions disposed adjacent to each other in the second direction dr2.

Figure 15:
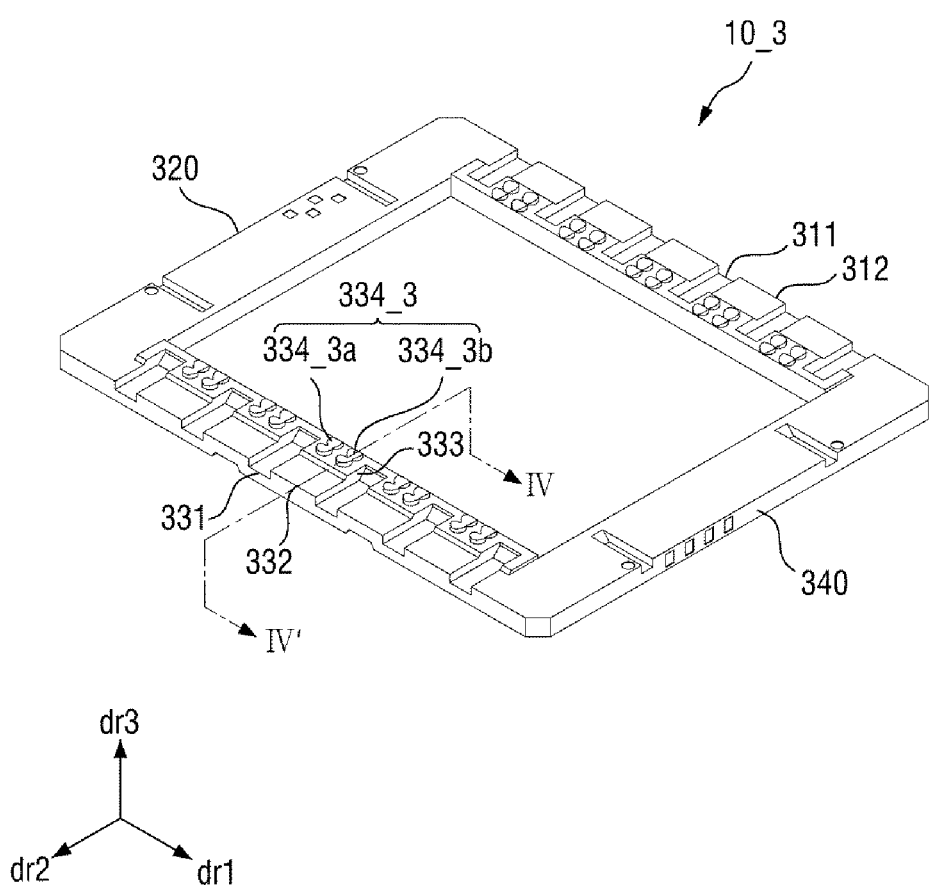
FIG. 15 is a perspective view of yet another embodiment of a mask frame of a mask unit.
Figure 16:
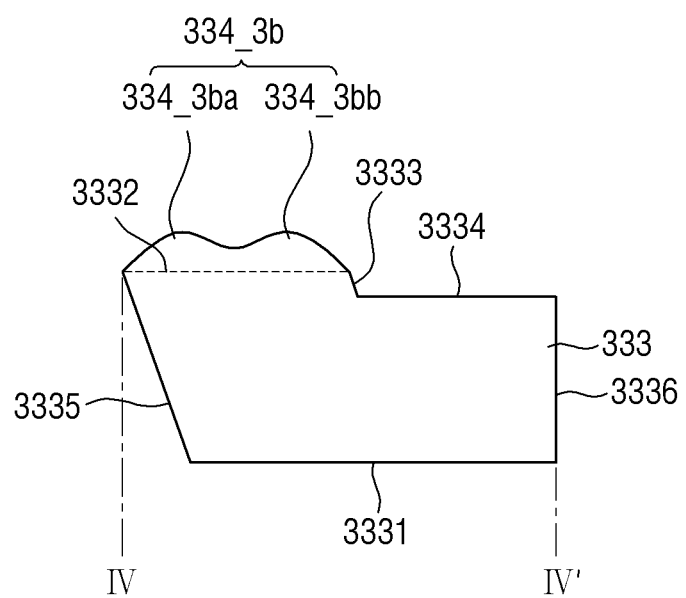
FIG. 16 is a cross-sectional view taken along line IV-IV' of FIG. 15.

FIG. 15 is a perspective view of yet another embodiment of a mask frame 10_3 of a mask unit. FIG. 16 is a cross-sectional view taken along line IV-IV' of FIG. 15.

Referring to FIGS. 15 and 16, the mask frame 10_3 of the mask unit is different from the mask frame 10 of FIGS. 2 and 7 in that the mask frame 10_3 includes a plurality of contact surfaces which contact a same one of the mask sheet 20a.

The mask frame 10_3 may include a plurality of bonding surfaces that each contacts a same one of the mask sheet 20a. That is, a bonding portion member 334_3 may include a plurality of bonding portions 334_3a and 334_3b that each overlap one of the support portion 333. Each of the bonding portions 334_3a and 334_3b may include a plurality of protrusions 334_3ba and 334_3bb that each contact a same one of the mask sheet 20a.

The bonding portion member 334_3 may include a first bonding portion 334_3a and a second bonding portion 334_3b disposed adjacent to each other in the first direction dr1. Both the first bonding portion 334_3a and the second bonding portion 334_3b may be provided or formed on a first upper surface of the support portion 333. Both the first bonding portion 334_3a and the second bonding portion 334_3b may contact a same one of the mask sheet 20a. The first bonding portion 334_3a and the second bonding portion 334_3b may each include a contact area which is welded to a same one of the mask sheet 20a.

Each of the first bonding portion 334_3a and the second bonding portion 334_3b may include a first protrusion 334_3ba and a second protrusion 334_3bb. An upper surface of each of the first protrusion 334_3ba and the second protrusion 334_3bb may have a shape of a circular arc in cross-section. The first protrusion 334_3ba and the second protrusion 334_3bb may be spaced apart from each other in the second direction dr2 with the first upper surface of the support portion 333 interposed therebetween or the first protrusion 334_3ba and the second protrusion 334_3bb may contact each other in the second direction dr2.

Figure 17:
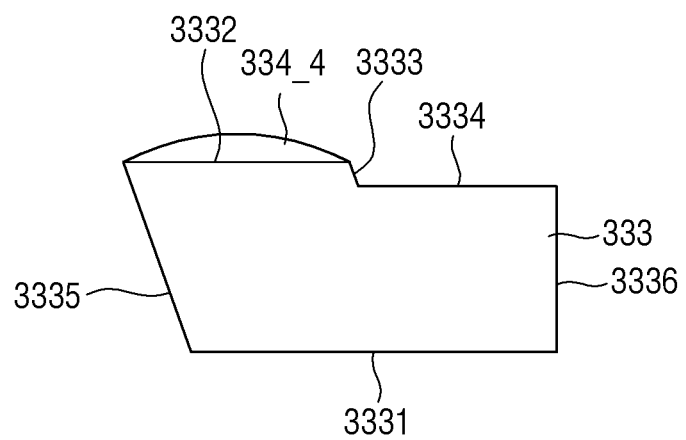
FIG. 17 is a cross-sectional view of yet another embodiment of a mask frame of a mask unit.

FIG. 17 is a cross-sectional view of yet another embodiment of a mask frame of a mask unit.

Referring to FIG. 17, the mask frame of the mask unit is different from the mask frame 10 of FIG. 7 in that a support portion 333 and a bonding portion 334_4 include different materials from each other. A solid line is shown in FIG. 17 between the support portion 333 and the bonding portion 334_4 to indicate the different materials.

As described above, the support portion 333 may include a metal material with relatively high rigidity, for example, a metal such as stainless steel.

In an embodiment, the support portion 333 and the bonding portion 334_4 may include different materials from each other. In an embodiment, for example, the bonding portion 334_4 may include any one of aluminum, an aluminum alloy, copper, a copper alloy, nickel, a nickel alloy, magnesium, and a magnesium alloy.

The bonding portion 334_4 may be provided or formed on an upper surface of the support portion 333. In the cross-section of the mask frame in FIG. 17, the bonding portion 334_4 may be provided or formed on a first upper side 3332 and may not be provided or formed on a second upper side 3334. That is, the bonding portion 334_4 may contact the first upper side 3332 of the support portion 333 and may not contact the second upper side 3334 thereof.

The bonding portion 334_4 and the support portion 333 may be physically bonded to each other or may be chemically bonded to each other.

Here, when the bonding portion 334_4 and the support portion 333 are physically bonded to each other, the bonding portion 334_4 and the support portion 333 are bonded together using a coupling member (such as bolts and nuts) or by applying relatively high pressure thereto.

Here, when the bonding portion 334_4 and the support portion 333 are chemically bonded to each other, the bonding portion 334_4 and the support portion 333 are bonded together by forming or depositing the material of the bonding portion 334_4 directly on the support portion 333, by using an adhesive, or by partially melting the bonding portion 334_4 with heat.

According to one or more embodiment, a mask unit includes a mask sheet in which relatively high-resolution patterns are defined. The mask sheet may secure a sufficient contact area under tension in the process of fixing the mask sheet to a mask frame and may not be penetrated or torn by welding.

However, the effects of the embodiments are not restricted to the one set forth herein. The above and other effects of the embodiments will become more apparent to one of ordinary skill in the art to which the embodiments pertain by referencing the claims.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A deposition mask unit comprising:
a deposition mask sheet comprising a plurality of openings, and
a deposition mask frame comprising a raised portion at which the deposition mask sheet is bondable to the deposition mask frame, the raised portion comprising:
a support portion, and
a bonding portion protruding from an upper surface of the support portion, an upper surface of the bonding portion being furthest from the support portion and curved,
wherein
the deposition mask sheet bonded to the deposition mask frame is bonded at the upper surface of the bonding portion of the deposition mask frame, and
the deposition mask sheet which is bonded at the bonding portion of the deposition mask frame includes:
an extended portion from the bonding portion to an end of the deposition mask sheet, and
the extended portion overlapping the support portion of the deposition mask frame and spaced apart from the upper surface of the bonding portion.

2. The deposition mask unit of claim 1, wherein a thickness of the deposition mask sheet is about 1 micrometer to about 100 micrometers.

3. The deposition mask unit of claim 2, wherein a maximum height of the upper surface of the bonding portion from the upper surface of the support portion is equal to the thickness of the deposition mask sheet.

4. The deposition mask unit of claim 1, wherein
a deposition material is passable through the plurality of openings of the deposition mask sheet, and
a distance between adjacent openings among the plurality of openings is about 5 micrometers to about 15 micrometers.

5. The deposition mask unit of claim 4, wherein a number of the plurality of the openings is about 1,000,000 or more.

6. The deposition mask unit of claim 1, wherein a maximum height of the upper surface of the bonding portion from the upper surface of the support portion is about 0.01 millimeter to about 0.03 millimeter.

7. The deposition mask unit of claim 1, wherein the support portion of the deposition mask frame comprises:
a lower surface opposite to the upper surface of the support portion, and
the upper surface of the support portion comprises a first upper surface portion and a second upper surface portion located at different heights from the lower surface.

8. The deposition mask unit of claim 7, wherein
a first thickness of the deposition mask frame taken between the lower surface and the first upper surface portion is about 15 millimeters to about 20 millimeters, and
a second thickness of the deposition mask frame taken between the lower surface and the second upper surface portion is about 12 millimeters to about 16 millimeters.

9. The deposition mask unit of claim 7, wherein the support portion further comprises an intermediate side surface which connects the first upper surface portion and the second upper surface portion to each other, the intermediate side surface being inclined with respect to the lower surface.

10. The deposition mask unit of claim 7, wherein the support portion and the bonding portion comprise different materials from each other.

11. The deposition mask unit of claim 10, wherein the bonding portion comprises at least one of aluminum, copper, nickel and magnesium.

12. The deposition mask unit of claim 10, wherein
a height of the first upper surface portion from the lower surface is greater than a height of the second upper surface portion from the lower surface, and
the bonding portion protrudes from the first upper surface portion.

13. A deposition mask unit comprising:
a plurality of deposition mask sheets each comprising a plurality of openings; and
a deposition mask frame comprising a plurality of raised portions at which the plurality of the deposition mask sheets is respectively bondable to the deposition mask frame, the plurality of raised portions spaced apart from each other in a first direction by a plurality of depressed portions,
wherein each of the raised portions comprises:
- a support portion,
- a bonding portion protruding from an upper surface of the support portion, and
- an upper surface of the bonding portion which is furthest from the support portion and curved, and the plurality of the deposition mask sheets bonded to the deposition mask frame disposes:
- the plurality of the deposition mask sheets contacting the upper surface of the bonding portion which is curved,
- extended portions of the plurality of deposition mask sheets extending from the bonding portion to respective ends of the plurality of deposition mask sheets, and
- the extended portions overlapping the support portion of the deposition mask frame and spaced apart from the upper surface of the bonding portion.

14. The deposition mask unit of claim 13, wherein the raised portions and the depressed portions alternate with each other in the first direction.

15. The deposition mask unit of claim 13, wherein deposition mask sheets among the plurality of the deposition mask sheets bonded to the deposition mask frame are spaced apart from each other in the first direction.

16. The deposition mask unit of claim 15, wherein the plurality of the deposition mask sheets bonded to the deposition mask frame disposes the depressed portions respectively between adjacent deposition mask sheets among the plurality of the deposition mask sheets.

17. The deposition mask unit of claim 13, wherein the plurality of the deposition mask sheets bonded to the deposition mask frame is welded to the upper surface of the bonding portion.

18. The deposition mask unit of claim 13, wherein
- the deposition mask frame defines an opening area, and
- the plurality of the deposition mask sheets bonded to the deposition mask frame overlaps the opening area.

19. The deposition mask unit of claim 18, wherein the plurality of the deposition mask sheets comprises an Invar alloy.

* * * * *